United States Patent
Ledezma et al.

(10) Patent No.: US 9,609,777 B2
(45) Date of Patent: Mar. 28, 2017

(54) PLUGGABLE POWER CELL FOR AN INVERTER

(71) Applicant: TECO-Westinghouse Motor Company, Round Rock, TX (US)

(72) Inventors: Enrique Ledezma, Austin, TX (US); Thomas Keister, Georgetown, TX (US); Mehdi Abolhassani, Austin, TX (US); Ryan Edwards, Round Rock, TX (US); Alex Skorcz, Cedar Park, TX (US); Randall Pipho, Leander, TX (US); Srinivas Satumahanti, Austin, TX (US)

(73) Assignee: TECO-Westinghouse Motor Company, Round Rock, TX (US)

( * ) Notice: Subject to any disclaimer, the term of this patent is extended or adjusted under 35 U.S.C. 154(b) by 0 days.

(21) Appl. No.: 14/976,323

(22) Filed: Dec. 21, 2015

(65) Prior Publication Data

US 2016/0105986 A1    Apr. 14, 2016

Related U.S. Application Data

(62) Division of application No. 13/362,479, filed on Jan. 31, 2012, now Pat. No. 9,220,179, which is a division (Continued)

(51) Int. Cl.
*H05K 5/00* (2006.01)
*H05K 7/14* (2006.01)
(Continued)

(52) U.S. Cl.
CPC .............. *H05K 7/14* (2013.01); *H02M 7/003* (2013.01); *H05K 7/1432* (2013.01); *H02M 7/49* (2013.01); *Y10T 307/297* (2015.04)

(58) Field of Classification Search
CPC ...................................................... H05K 7/14
(Continued)

(56) References Cited

U.S. PATENT DOCUMENTS 3,581,212 A   5/1971   McMurray
3,659,239 A   4/1972   Marton
(Continued)

FOREIGN PATENT DOCUMENTS

CN    1427521    7/2003

OTHER PUBLICATIONS

Dr. Keith Corzine, "Operation and Design of Multilevel Invaders," Developed for the Office of Naval Research, Dec. 2003, Revised Jun. 2005, pp. 1-79.

(Continued)

*Primary Examiner* — Stephen W Jackson
(74) *Attorney, Agent, or Firm* — Trop, Pruner & Hu, P.C.

(57) ABSTRACT

In one embodiment, a power cell chamber for a drive system includes moveable and fixed portions. The moveable portion includes a rectifier stage to rectify an input signal received from a secondary winding of a transformer to provide a rectified signal and an inverter stage having a plurality of switching devices to receive a DC signal and output an AC signal. This moveable portion can be slidably adapted within a cabinet of the drive system. In turn, the fixed portion includes a DC link having at least one capacitor to receive the rectified signal and provide the DC signal to the inverter stage.

8 Claims, 15 Drawing Sheets

Related U.S. Application Data of application No. 12/495,359, filed on Jun. 30, 2009, now Pat. No. 8,130,501.

(51) Int. Cl.
*H02M 7/00* (2006.01)
*H02M 7/49* (2007.01)

(58) Field of Classification Search
USPC .......................................................... 361/730
See application file for complete search history.

(56) References Cited

U.S. PATENT DOCUMENTS

| | | | |
|---|---|---|---|
| 3,867,643 A | 2/1975 | Baker et al. | |
| 4,052,657 A | 10/1977 | Kleiner et al. | |
| 4,674,024 A | 6/1987 | Paice et al. | |
| 4,691,274 A | 9/1987 | Matouk et al. | |
| 5,576,943 A | 11/1996 | Keir | |
| 5,619,407 A | 4/1997 | Hammond | |
| 5,625,545 A | 4/1997 | Hammond | |
| 5,638,263 A | 6/1997 | Opal et al. | |
| 5,644,483 A | 7/1997 | Peng et al. | |
| 5,734,565 A | 3/1998 | Mueller et al. | |
| 5,986,909 A | 11/1999 | Hammond et al. | |
| 6,005,788 A | 12/1999 | Lipo et al. | |
| 6,014,323 A | 1/2000 | Aiello et al. | |
| 6,031,738 A | 2/2000 | Lipo et al. | |
| 6,166,513 A | 12/2000 | Hammond | |
| RE37,126 E | 4/2001 | Peng et al. | |
| 6,222,284 B1 | 4/2001 | Hammond et al. | |
| 6,229,722 B1 | 5/2001 | Ichikawa et al. | |
| 6,236,580 B1 | 5/2001 | Aiello et al. | |
| 6,262,555 B1 | 7/2001 | Hammond et al. | |
| 6,301,130 B1 | 10/2001 | Aiello et al. | |
| 6,320,767 B1 | 11/2001 | Shimoura et al. | |
| 6,340,851 B1 | 1/2002 | Rinaldi et al. | |
| 6,377,478 B1 | 4/2002 | Morishita | |
| 6,563,410 B1 | 5/2003 | Marton | |
| 6,621,719 B2 | 9/2003 | Steiner et al. | |
| 6,653,744 B2 | 11/2003 | Stricker | |
| 6,697,271 B2 | 2/2004 | Corzine | |
| 6,898,095 B2 | 5/2005 | Bijlenga et al. | |
| 7,164,201 B2 | 1/2007 | Manz et al. | |
| 7,190,070 B2 | 3/2007 | Manz et al. | |
| 7,242,584 B2 | 7/2007 | Kroneder | |
| 7,358,442 B2 | 4/2008 | Radosevich et al. | |
| 7,568,931 B2 | 8/2009 | Hammond | |
| 7,876,561 B2 | 1/2011 | Schnetzka et al. | |
| 8,008,923 B2 | 8/2011 | Hammond | |
| 8,130,501 B2 * | 3/2012 | Ledezma | H02M 7/003 |
| | | | 307/10.6 |
| 8,570,774 B2 | 10/2013 | Wang et al. | |
| 9,220,179 B2 * | 12/2015 | Ledezma | H02M 7/003 |
| 2006/0095728 A1 | 5/2006 | Hammond et al. | |
| 2006/0208660 A1 | 9/2006 | Shinmura et al. | |
| 2008/0079314 A1 | 4/2008 | Hammond | |
| 2008/0081244 A1 | 4/2008 | Hammond | |
| 2008/0088186 A1 | 4/2008 | Hammond | |
| 2008/0174182 A1 | 7/2008 | Hammond | |
| 2009/0021922 A1 | 1/2009 | Popp et al. | |
| 2009/0065174 A1 | 3/2009 | Lai et al. | |
| 2009/0073622 A1 | 3/2009 | Hammond | |
| 2010/0301975 A1 | 12/2010 | Hammond | |
| 2010/0328848 A1 | 12/2010 | Ledezma et al. | |

OTHER PUBLICATIONS

U.S. Appl. No. 12/284,649, filed Sep. 24, 2008 entitled, "Modular Multi-Pulse Transformer Rectifier for Use in Symmetric Multi-Level Power Converter," by Mehdi Abolhassani, et al.

U.S. Appl. No. 12/317,957, filed Dec. 31, 2008 entitled, "Partial Regeneration in a Multi-Level Power Inverter," by Mehdi Abolhassani, et al.

U.S. Appl. No. 12/495,385, filed Jun. 30, 2009 entitled, "Providing Modular Power Conversion," by Enrique Ledezma, et al.

Patent Cooperation Treaty, Notification of Transmittal of the International Search Report and the Written Opinion of the International Search Authority mailed Feb. 8, 2011 in International application No. PCT/US2010/040293.

State Intellectual Property Office, P.R. China, Office Action and Search Report mailed Apr. 12, 2013, in Chinese application No. 201080002867.0.

U.S. Patent and Trademark Office, Notice of Allowance mailed Jul. 10, 2013 in U.S. Appl. No. 13/050,064.

State Intellectual Property Office, P.R.China, Office Action mailed Dec. 6, 2013, in Chinese application No. 201080002867.0.

Chinese Patent Office, Office Action Mailed Aug. 7, 2014, in Chinese Application No. 201080002867.0.

* cited by examiner

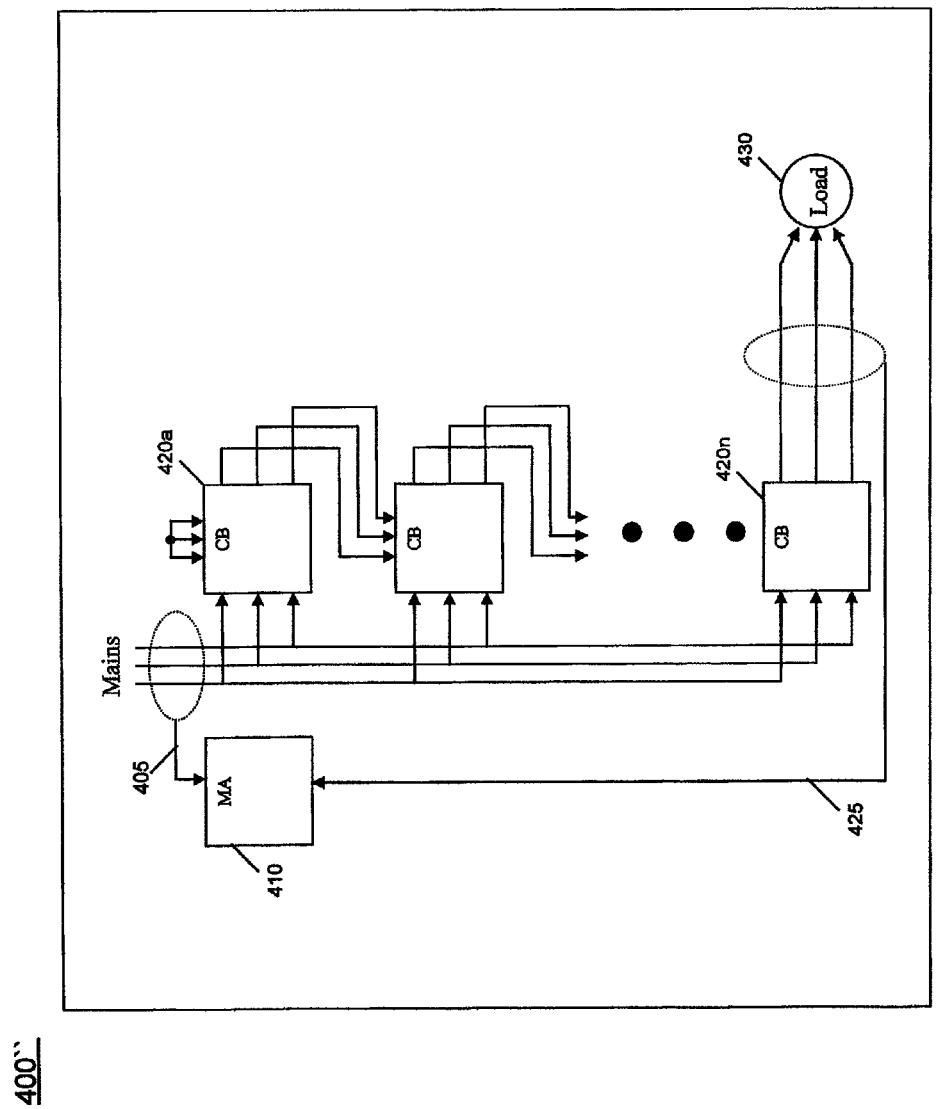

PLUGGABLE POWER CELL FOR AN INVERTER

This application is a divisional of U.S. patent application Ser. No. 13/362,479, filed Jan. 31, 2012, which is a divisional of U.S. patent application Ser. No. 12/495,359, filed Jun. 30, 2009, now U.S. Pat. No. 8,130,501, issued Mar. 6, 2012, the content of which is hereby incorporated by reference.

BACKGROUND

Generally, equipment referred to as a power converter, inverter or drive is used to provide power to another piece of equipment such as a motor. Specifically, such a converter (converter is used generally herein to refer to converters, inverters and drives) is coupled to a utility connection to receive incoming input power such as three-phase AC power. The converter conditions the power to provide a conditioned power to the equipment or load. In this way, incoming power to the load may be of improved efficiency, leading to reduced costs to operate the equipment.

Multi-level power converters have been gaining popularity mainly due to improved input and output harmonics content, better electromagnetic compatibility, and higher voltage capability. These improvements in power conversion are achieved by using a multiple voltage step strategy. One common multi-level inverter topology is based on H-bridge inverters, in which multiple H-bridge inverters are connected in series. Since this topology consists of series power conversion cells, the voltage and power level may be easily scaled.

Multi-level power converters are used to provide power to a load such as a motor. Oftentimes, such multi-level converters are implemented as a large piece of equipment that is housed in a cabinet that receives incoming power, e.g., from a utility connection, conditions the power and provides it to a coupled load. In general, a drive system includes one or more transformers that have secondary windings that are coupled to individual power cells that perform rectification, inversion, and other conditioning tasks. Typically, to perform these functions each power cell includes a rectifier, DC link capacitor and inverter, among other such equipment, and each such power cell is packaged together into a module.

However, as voltage and power requirements increase in a system, these modules can be relatively cumbersome, bulky and expensive. For example, in medium voltage (MV) applications, such power cells can easily exceed 50 pounds due to the size of the DC link capacitors and other components present. Another drawback of this conventional design of power cells of a drive system includes a costly and complex customized isolation system as voltage levels increase from a few kilovolts to tens of kilovolts. In general, power cells are provided as a fixed enclosed module customized for a given power and voltage level. For example, power cells for 4160V at 1000HP applications will radically increase foot print and weight over a power cell designed for 3300V at the same output power. In addition, the overall MV converter package must be individually designed to meet a particular power output, such as 5000HP, 10000HP, 20000HP applications, control, and protection specifications.

In current medium voltage drives, a cascaded topology is implemented using a partial modular design. Specifically, the only subcomponent of the system that is common across drive products of a family is the power cell, which as described above contains the power components including inverter, rectifier, and DC-link. Current medium voltage drives have excluded all other system components, including transformers, control, cooling system, communication distribution, packaging, and electrical insulation, from a modular approach. Instead, these major components are optimized for voltage and power rating of a specific design and thus are not easily transferable to other drive ratings.

SUMMARY OF THE INVENTION

Embodiments introduce a cell integration method to reduce cell foot print and weight, and a method to increase the cell power density. In addition, embodiments provide a cell voltage isolation method to meet requirements up to several tens of kilovolts and provide a modular high power building block or cabinet configuration. This high power building block provides an efficient way to series and/or parallel power cells. The number of series or parallel power cells is only limited by the drive application. The cabinet configuration is based on a modular power transformer, small size pluggable power cell system, a reconfigurable electrical insulation method, and a master-slave control scheme. Embodiments provide overall system power and voltage scalability, standardized design, and easy reconfiguration to meet a wide power range in MW levels.

In various embodiments, a complete modular design establishes subcomponents for most major drive elements including power cell, transformer, control, cooling system, communication distribution, packaging, and electrical insulation. Each component may have different versions to accommodate multiple voltage and power ratings.

According to one aspect of the present invention, a power cell chamber for a drive system includes moveable and fixed portions. The moveable portion includes a rectifier stage to rectify an input signal received from a secondary winding of a transformer to provide a rectified signal and an inverter stage having a plurality of switching devices to receive a DC signal and output an AC signal. This moveable portion can be slidably adapted within a cabinet of the drive system. In turn, the fixed portion includes a DC link having at least one capacitor to receive the rectified signal and provide the DC signal to the inverter stage. The fixed portion is affixed in the cabinet, and the moveable portion is separate from the fixed portion.

In some implementations, the fixed portion includes an input cell protection mechanism coupled between a corresponding secondary winding and a power service bus, and a bypass block to enable bypass of the power cell chamber. The moveable portion can be formed of an enclosure having switching devices of the inverter stage on a first side and a plurality of rectification devices of the rectifier stage on an opposite side. In addition, a low inductance path can be coupled between the switching devices and the rectification devices, and may include at least one local capacitor to snub transients.

Yet another aspect of the present invention is directed to local low inductance bus capacitors coupled to a rectifier and inverter. Such capacitors may be of a removable portion of a power cell chamber. In turn, a power capacitor of the power cell chamber, which may be of a fixed portion of the power cell chamber, can provide a DC bus voltage to the removable portion. The local capacitors can be useable in a diagnostic mode in which the power capacitor is not available, and can further provide snubbing protection in a normal operation mode of a system including the power cell chamber.

A still further aspect of the present invention is directed to a medium voltage drive system with modular cabinets, each of which includes a transformer bay to house at least one transformer and a power cell bay including cell chambers each having a protective enclosure in which to house a power cell. Each modular cabinet may further include a cabinet controller bay having a cabinet controller to receive reference control signals from a master controller. In turn, the master controller is coupled to the cabinet controllers to receive input current information, output current information, command parameters regarding a selected operating point of the medium voltage drive system, and status information from the modular cabinets, and to provide the reference control signals to the cabinet controllers.

BRIEF DESCRIPTION OF THE DRAWINGS

FIG. 8C is a block diagram of a series modular system configuration in accordance with one embodiment of the present invention.

DETAILED DESCRIPTION

In various embodiments, a power cell chamber can be separated into multiple portions, namely a stationary or fixed portion and a moveable portion. These different portions may be joined by a power service bus. In this way, a module or other housing or enclosure that forms the moveable portion can be made to be relatively small and lightweight as compared to a conventional power cell. This allows for greater ease of customer access and removal, repair and replacement operations on these moveable portions of a power cell. In turn, the moveable portion may be plugged into a power service bus that couples the moveable portion with the fixed portion within the power cell chamber. The fixed portion of the chamber may include various components that would conventionally be present in a single power cell enclosure including, for example, a DC link by way of one or more capacitors. As such components can be relatively reliable over a number of years, these components present in the fixed portion may be provided on an opposite side of the power service bus from the moveable portion. As used herein, "fixed" or "stationary" means that a component is physically attached directly within a cabinet, not readily customer accessible, and cannot be inserted and removed by simple pluggable/slidable means. Instead, special access and tools are needed to insert or remove the component. In contrast, "moveable" or "pluggable" means a component or group of components that are easily inserted and removed from a cabinet, e.g., via sliding, plugging and so forth without the need for tools, and having ready customer access.

Embodiments may provide for a modular cabinet-based drive system that can be used to provide regulated power at a wide range of voltages. For example, some applications may be used for low voltage applications. As used herein, low voltage is used to denote voltages of 600 volts and below. Others may be used for medium voltage applications. As used herein, medium voltage is used to denote voltages between approximately 600 volts and 35000 volts. Still further, owing to the separation between components of a conventional power cell and isolation afforded within a cabinet (as discussed below), embodiments also may be readily used for high voltage (HV) applications. As used herein, high voltage means greater than 35000 volts, e.g., 69000 volts.

Figure 1:
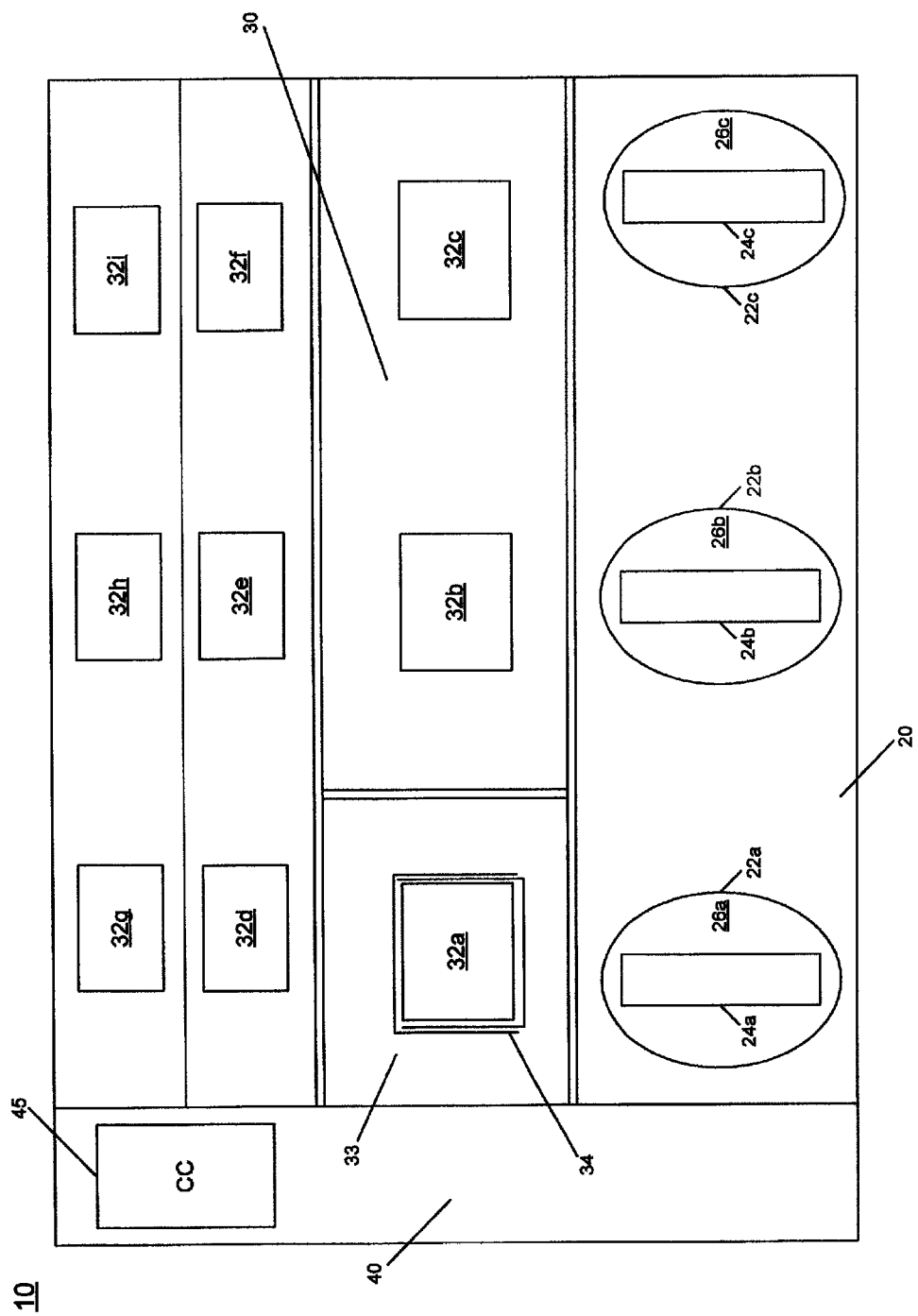
FIG. 1 is a block diagram view of a drive system adapted in a cabinet in accordance with one embodiment of the present invention.

Referring now to FIG. 1, shown is a block diagram view of a power cell cabinet in accordance with one embodiment of the present invention. As shown in FIG. 1, cabinet 10 may house at least a portion of a drive system such as a medium voltage drive system that can be a multi-level inverter. The view of FIG. 1 is with respect to a front portion of the cabinet. In general, the cabinet is arranged such that a plurality of transformers $22_a$-$22_c$ are present in a transformer bay 20, which may be configured in a lower portion of cabinet 10. In turn, a plurality of power cells $32_a$-$32_i$ may be configured within a power cell bay 30 of cabinet 10. In the embodiment shown in FIG. 1, nine such power cells are present, although the scope of the present invention is not limited in this regard. Also, while shown as single modules in the view of FIG. 1, understand that the portions of the power cells shown in FIG. 1 may correspond to the moveable portions adapted within enclosures. Unseen in FIG. 1 are the fixed portions of the power cell modules, which may be adapted to a rear portion of a power service bus, also not shown in FIG. 1.

In some implementations, a single modular power cell cabinet may be sufficient to provide desired power levels for a given system. In such implementations, a cabinet controller 45 present in a controller bay 40 may be used to handle control of the drive system. However, many embodiments may aggregate a plurality of power cell cabinets with a respective cabinet controller 45 along with a single master controller cabinet 40 to control the cabinet arrangement and increase the power capabilities. In these implementations, controller bay 40 including cell controller 45 may in turn be coupled, e.g., via a fiber optic interface to a master controller cabinet (not shown in FIG. 1). Furthermore, in implementations in which a single power cell cabinet is present, a separate cabinet may provide a user interface. That is, to provide user access to information regarding a drive system, a user interface may be present. Such user interface may include a display and an input mechanism such as a key pad or keyboard to enable user input of information and control of various operations including diagnostics and so forth. In other implementations, a master controller cabinet may include such a user interface.

With reference to the transformers of FIG. 1, each transformer may be configured in a horizontal manner having a core 24 and multiple windings adapted there around, including a primary winding and a set of secondary windings. In addition, some embodiments may further include one or more auxiliary windings to provide power to auxiliary equipment such as fans or the like. Each transformer 22 may be a three-phase transformer that receives three-phase power from a utility connection and provides power to one or more of the power cells (although only a single phase is shown in FIG. 1). More specifically, each transformer may include three sets of secondary windings to provide power to a corresponding power cell. In one implementation transformer 22a may provide power to the power cells with which it is generally vertically aligned with, namely power cells 32a, 32d, and 32g. Similar connections can be configured for transformers 22b and 22c. However, other implementations are possible. Note that the primary windings, secondary windings or both may be phase-shifted in some implementations.

By providing transformers in a generally horizontal configuration, improved airflow is realized. For purposes of cooling the transformers and the cabinet in general, a substantially linear and laminar airflow may be provided, e.g., from forward to rear of the cabinet such that the air blows through the windings of the transformers. While ambient air cooling can be used in many implementations, some embodiments may provide some type of liquid cooling for the transformers as well. Further details regarding the horizontal nature of the transformers will be discussed below.

As further seen in FIG. 1, each power cell chamber 33 (i.e., both the moveable and fixed portions) can be configured as an enclosure (only one representative such chamber shown in FIG. 1). Such cell chamber can be formed using an insulative material such as a polypropylene or other plastic or other such material. Still further, to provide electrical isolation between the power cells and other equipment in cabinet 10, an isolation barrier 34 can be provided in each chamber (note only one such isolation barrier 34 is shown). As seen, isolation barrier 34 is formed of a plurality of individual members in an interlocking manner to provide efficient isolation. In various embodiments, isolation barrier 34 may be formed of sheets of an insulating material such as FORMEX™ or other such material. While shown with only a few such members for ease of illustration in the embodiment of FIG. 1, understand that many such members, e.g., 2 or many more may be provided, as these individual members can be of relatively thin width, e.g., 9.8 to 125.2 mils. In this way, an insulating bubble is formed around each power cell to facilitate voltage insulation. Such insulation may enable a single generic cabinet architecture to be used with a wide variety of voltages, from low voltage applications all the way up to high voltage applications. Generally as the voltage application increases, the number of sheets and thus relative thickness may also increase.

Understand that while shown with this particular implementation in the embodiment of FIG. 1 with the power cells configured above transformers, the scope of the present invention is not limited in this manner. Furthermore, understand that additional components may be present in a given drive system, and the illustration of FIG. 1 is at a high level to identify the main components and their general location within a system.

Figure 2A:
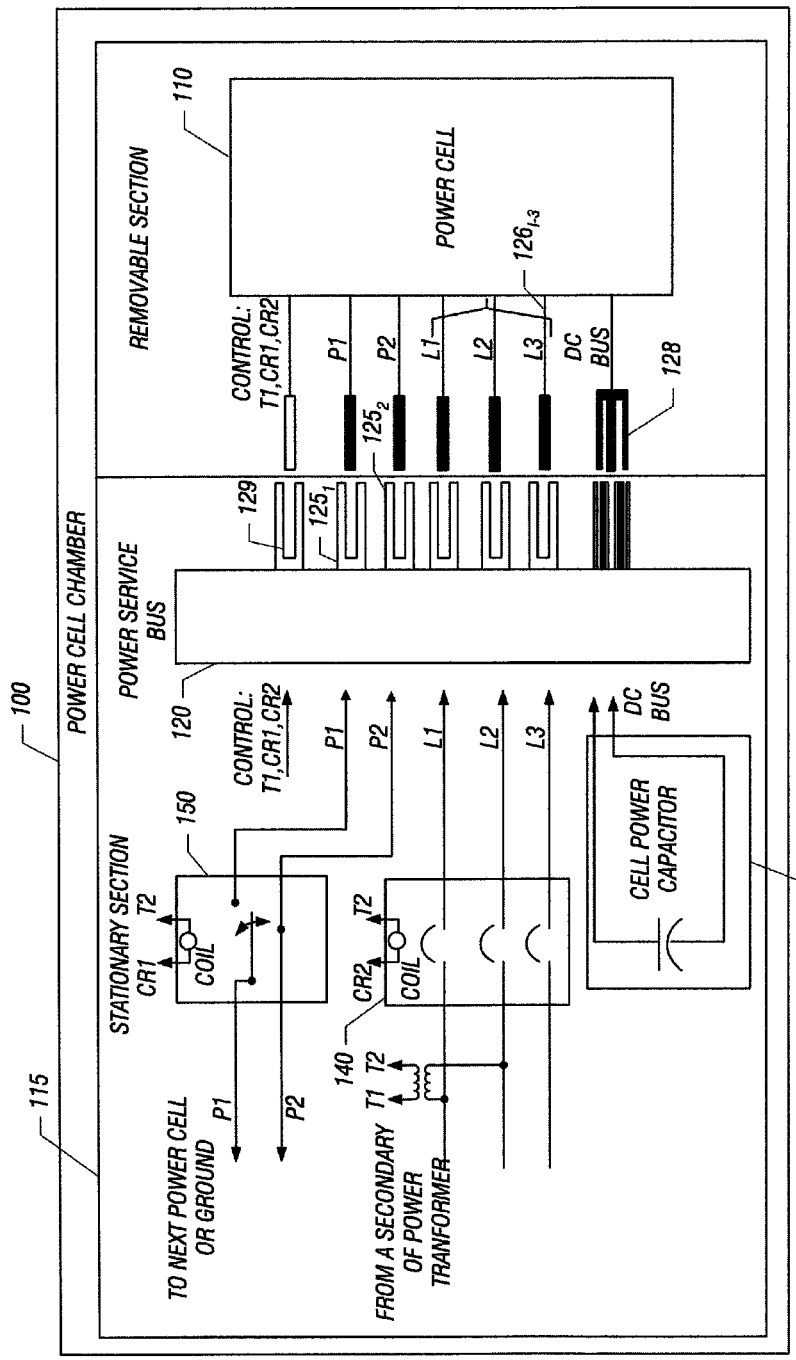
FIG. 2A is a schematic diagram of components within a power cell chamber in accordance with one embodiment of the present invention.

Referring now to FIG. 2A, shown is a schematic diagram of components within a power cell chamber in accordance with one embodiment of the present invention. As shown in FIG. 2A, chamber 100 is adapted to include both the fixed and moveable portions. A given drive system may include multiple such chambers to form the drive system. In various implementations a power cell module 110 may correspond to the moveable portion of the power cell chamber and may be accessed via a front panel of a cabinet, whereas a fixed portion 115 of the chamber may be accessible via a rear panel of the cabinet or via a front panel when the cell module 110 is not present or is otherwise removed. Thus as shown in FIG. 2A, from right to left generally corresponds to a direction from a front to a rear of a cabinet. Details of the movable power cell are described further below. In general, the moveable portion may include the rectification and inverter stages of a cell (but not the DC-link power capacitor).

Power cell module 110 may couple to a power service bus 120 via a plurality of pluggable terminals located on a back portion thereof. Power service bus 120 may have various connectors to mate with the terminals of power cell module 110. In some embodiments, power cell module 110 may be installed via blind mating connections with corresponding connectors of power service bus 120. As will be described below, power cell module 110 may include a rectifier section and an inverter section. The rectifier section may include a plurality of diodes coupled to the inputs from the transformer secondary, along with at least one parallel-connected local capacitor that in turn is coupled to a local capacitor low inductance bus. Similarly, the inverter section may be, for example, an H-bridge inverter including a plurality of switching devices such as IGBTs and further may include a parallel-connected local capacitor. The local capacitor may provide diagnostics and snubber protection capability to the power cell. In different implementations, this capacitor may be sized from a few tens to a few hundreds of nanofarads. In turn, the inverter section is also coupled to the local capacitor low inductance bus. This bus may be constructed in a manner to provide a low inductance path. In various embodiments, the inductance may be between a few nanohenries to less than 20 nanohenries and the bus may be formed from a laminate material and provide connections between these two sections in a low inductance manner.

In a given implementation, power cell module 110 may be formed having dual cooling plate heat sinks, e.g., on top and bottom. In various implementations, various controller boards may be present in module 110. One of the boards provides gate signals to control the H-bridge inverter, while a second board provides input current and DC bus voltage sensing capability for the power cell. A third board may be in communication with these controller boards and may be also implemented within the plug-in section of the cell chamber 110 and which in turn can be coupled via a fiber optic interface to the respective cabinet controller. A power supply also may be present within module 110, and which may be used to provide a low voltage supply to, e.g., the internal cell controller boards.

In the embodiment shown in FIG. 2A, input, output, DC bus, and control signal connections of a power cell may be provided via a number of blind mating connectors to couple to bus 120. Note that bus 120 may also include a DC low inductance bus. In general, this bus may use at least some of the following to enable a low inductance connection: the bus may be formed of a laminate material, e.g., multiple copper sheets and an insulation sheet to provide electrical isolation to the arrangement. As seen in FIG. 2A, the AC output of the power cell is connected using plug-in connectors $125_1$ and $125_2$. In turn, an input connection to the cell from secondary windings of a transformer may be coupled to power cell 110 via connectors $126_1$-$126_3$ (in a three-phase implementation). In turn, a DC bus connector 128 may couple a DC bus link between power cell 110 and a capacitor 130. In one embodiment, connector 128 may be formed of a single connection having a plurality of concentric fixed connectors to mate with concentric fixed terminals to connect to a low inductance DC bus. The concentric connector 128 may connect to a cell DC-link power capacitor 130 and which is implemented in a fixed portion 115 of the power cell chamber formed on the opposite side of power service bus 120. The capacitor thus may be a remote capacitor with respect to the moveable power cell. In one such implementation this concentric connector may be a type of coaxial cylindrical cable that reduces the DC bus inductance. In other embodiments, low inductance may be realized by providing a number of connections for the positive and negative portions of the DC bus, e.g., four connectors in parallel, arranged horizontally or in any other pattern, two each for positive and negative portions. Note also a control connector 129 may provide various status and control signals through power service bus 120.

In one embodiment, capacitor 130 may be a single film power capacitor or a plurality of single film capacitors connected in series or parallel or a combination to fit a specific cell design. The capacitor configuration may range from thousands of microfarads to tens of thousands of microfarads and from a few tens to a few hundreds of amperes rms. The capacitor configuration 130 may operate from a DC bus which may be rated from a few hundred volts to several thousands of volts. Other implementations may use electrolytic or other type of capacitors. Each individual capacitor may further be associated with a discharge resistor. More than one such capacitor may be present, and thus the term "capacitor" as used herein refers to a combination of one or more capacitors. Capacitor configuration 130 may also be located on top or bottom of the moveable section of the power cell chamber but within the cell chamber.

In addition, fixed portion 115 may further include an input cell protection mechanism 140 such as circuit breakers or other protection mechanisms e.g., fuses to couple between the secondary windings of a transformer and power service bus 120. The input cell mechanism protection 140 may provide reliable short circuit protection and overload protection within a few 60Hz current cycles. The control trip scheme to operate mechanism 140 (not shown) may be implemented in moveable portion 110. Not shown in the embodiment of FIG. 2A are various control and switching signals that may couple between a cell and a master or cabinet controller (which may be outside of a given power cell chamber, but present in another part of a cabinet, for example).

In addition, a cell bypass block 150 may be provided in fixed portion 115, which may provide redundancy power/ bypass to a given power cell in a cell failure mode. This mechanism may be implemented using a shunt trip contactor controlled from a cabinet controller via the plug-in section and service bus. For example, during operation when a power switch failure is detected by signals sent to a master controller, the master controller may act to actuate block 150 to thus create a short circuit between the outputs of a power cell having a failure. With reference to FIG. 2A, by actuating a coil within bypass block 150, a short circuit between terminals P1 and P2 can be realized to thus bypass this power cell in case of a malfunction. For example, if power cell 32g (of FIG. 1) is disabled due to a failure in phase A, power cells 32d and 32a may be also disabled in phases B and C via the master controller to allow the drive system to continue functioning at reduced power and balance voltage output.

In one embodiment, block 150 may be an electronic switch coupled via a latching relay to a cabinet controller (not shown). The latching relay thus acts to take the signals from the cabinet controller and automatically control switching of bypass block 150 to open and close to thus provide bypass by responding to a fault command or other adverse condition. Similar connections may be present between a corresponding latching relay and input cell protection mechanism 140 to cause the breaker or other protection mechanism to be enabled to thus prevent input power from being applied to a given power cell. For instance, if a failure occurs in the rectifier section and detected by a current sensor located in the cell input (not shown in FIG. 2A), the input protection mechanism 140 may disable the power to the cell via 140, followed by the actuation of bypass block 150 to isolate the troubled cell. Under this scenario, a master controller may act to disable the entire drive system or bypass this cell to continue operation at reduced power. In some implementations the connection between the cabinet controller and latching relay or shunt trip circuit may be via fiber optic, although the scope of the present invention is not limited in this regard.

The structure of power service bus 120 holds concentric DC bus and other terminal mating accesses (plug-in style). Power service bus 120 may integrate bus bars for cell series output, bus bar for cell input, a low inductance laminated DC bus to connect to the DC-link power capacitor(s), and a G-10™ material to provide structural support and insulation between electric buses. In this way, series coupling of a group of power cells can occur to provide a phase output line to a load coupled to the drive system. In different implementations, the service bus can be formed using a division wall (e.g., G-10™ material) or an open structure to provide for air circulation.

Figure 2B:
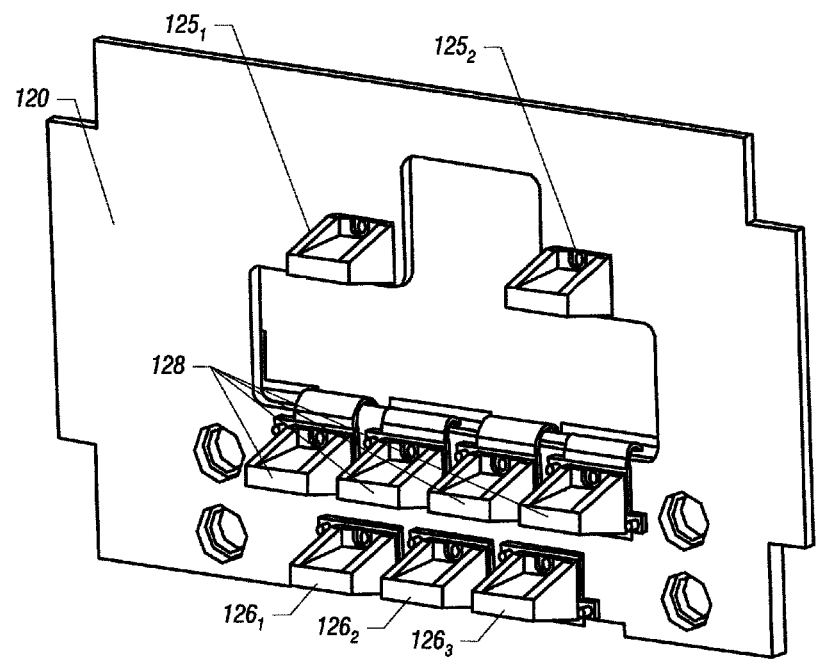
FIG. 2B is a block diagram illustrating connections available in a power service bus in accordance with an embodiment of the present invention.

Referring now to FIG. 2B, shown is a 3-D mechanical model illustrating connections available in a power service bus in accordance with an embodiment of the present invention. As shown in FIG. 2B, power service bus 120 may be formed using insulation material, e.g., G-10 and includes contacts for cell input, output, DC link, and control signals (not shown). Specifically as seen in FIG. 2B, at a top portion of power service bus 120, the cell outputs P1 and P2 may be adapted. Furthermore, the three connections L1-L3 at a bottom of the power service bus may provide the inputs from secondary windings of a transformer, while the DC link connections 128 may be provided via four individual connections, two positive and two negative.

Figure 2C:
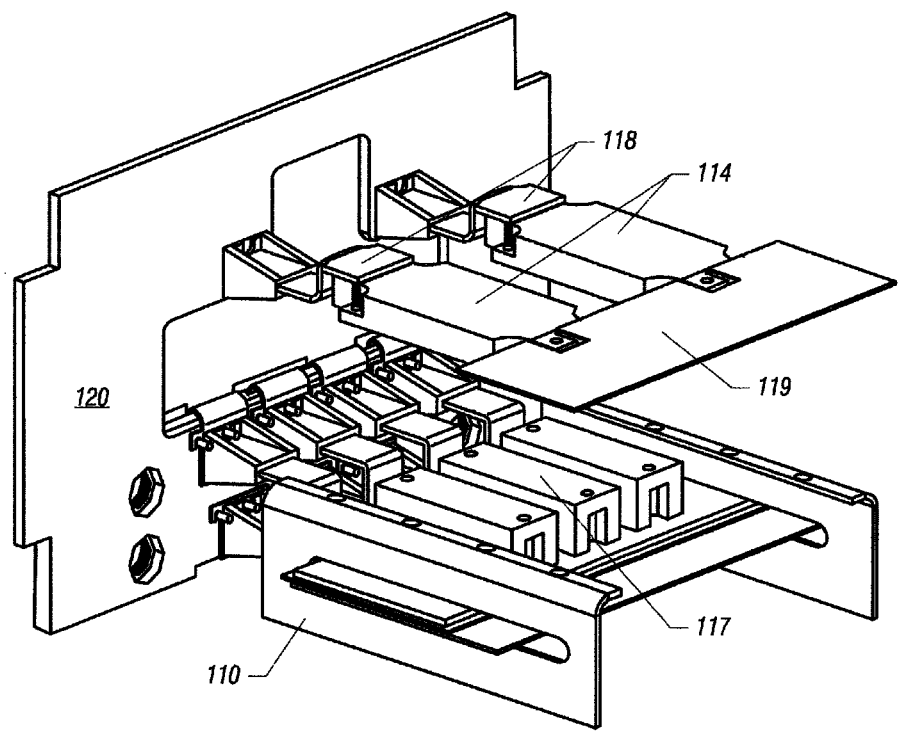
FIG. 2C is another view of a power service bus in accordance with one embodiment of the present invention.

Referring now to FIG. 2C, shown is another view of the power service bus that shows part of a moveable portion of a power cell chamber that provides connections to the cell inputs, outputs, as well as the DC link laminated buses in the moveable portion. Note that on the top portion of moveable module 110, a plurality of switching devices 114, which may be IGBTs are seen, while rectification devices 117 are present at the bottom of the cell. Switching devices 114 may be coupled between a laminated DC bus 119 and bus bars 118. As also seen in FIG. 2C, the output from a power cell is routed via connectors P1 and P2 from bus bars 118. Connectors P1 and P2 may provide connection to another power cell with which power cell 110 is coupled in series, namely another power cell of the same phase output line.

While shown with this particular implementation in the embodiment of FIGS. 2A-C, the scope of the present invention is not limited in this regard. For example, while it is assumed in this embodiment that power cell moveable portion 110 may not include the components of fixed portion 115 described above, in some implementations, a limited amount of local capacitance available in the power cell may be combined with the fixed capacitance present in the fixed portion within the power cell chamber in accordance with an embodiment of the present invention.

Figure 3:
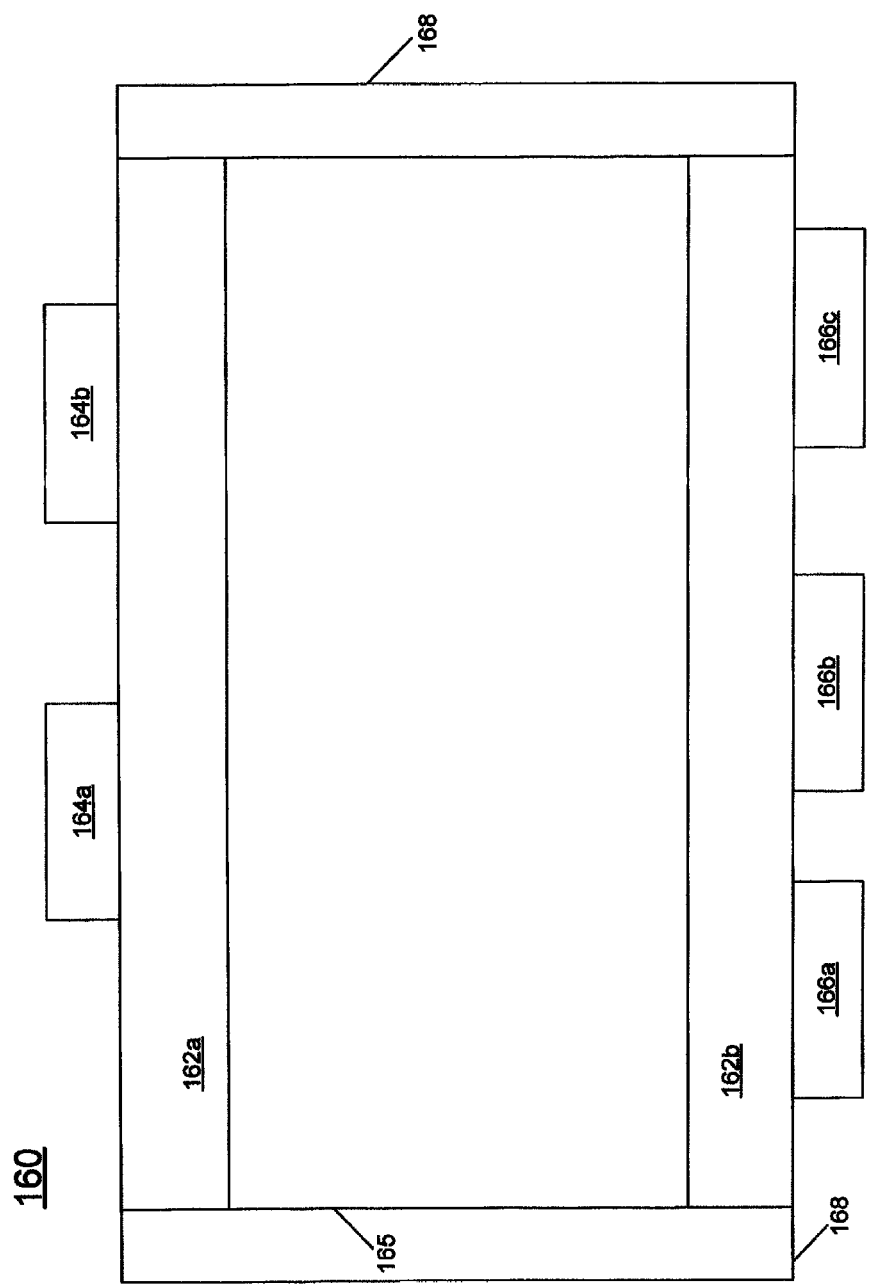
FIG. 3 is a block diagram view of a power cell module in accordance with one embodiment of the present invention.

Referring now to FIG. 3, shown is a block diagram view of a power cell module in accordance with one embodiment of the present invention. As shown in FIG. 3, module 160 may be a basic representation of a removable portion of a power cell. Not shown, an enclosure may be present and which may have various components present therein including, for example a local controller, input current and heat sink sensors, power switch gate drivers and a modular HV power supply. In addition, module 165 includes a split heat sink formed of cooling plate members $162_a$ and $162_b$, present on opposite sides of housing 165 to provide for improved thermal control and increased power density for module 160. While not shown in FIG. 3 for clarity, understand that the heat sink members may have a comb, fin, or fan-like structure to efficiently dissipate heat. The heat sink structure may include a cooling plate with a cooling fluid circulating in pipes through the plate with input/output leaving on the same or opposite sides of the housing. Different components can be coupled to the two heat sinks. In the implementation shown in FIG. 3 on a top portion, switching devices of an inverter stage may be present. As an example, switching devices $164_a$ and $164_b$ may be IGBTs. While shown in this front view in FIG. 3 as including only two such IGBT dual modules, understand that in various implementations an H-bridge of a power cell may include six-pack IGBT modules, and all of which may be adapted on a top portion of power cell enclosure 165. On the bottom portion, rectification devices $166_a$-$166_c$ of a rectifier stage may be present. Again, while shown with three such devices in FIG. 3, understand that additional rectification devices may be present in different embodiments. In some embodiments, the rectification section may be replaced by an active front end having six IGBT modules to provide regeneration capability in addition to the rectification. Also, by adapting the major components of the moveable portion of the power cell around an exterior of an enclosure 165, ease of access to the components for heat dissipation as well as increase of power density by maintaining same foot print for a wide range of power and utilizing none or limited DC-link capacitance. This also has a dramatic impact on size and weight reduction, and how diagnostics and removal, repair and replacement operations are realized.

To provide a low inductance path between the rectifier and inverter sections, two local film capacitors 168 that provide local ripple and full DC-link current circulation, may be adapted to the outside of enclosure and coupled to the switching devices and rectification devices by way of corresponding sets of terminals (note the terminals are not shown in FIG. 3). This low inductance path has reduced parasitics and provides an adequate path for DC current circulation, as well as for performing snubbing of transients that may arise during normal operation to improve inverter cell performance. In this way, local capacitors 168 may be used to provide a low inductance path directly between rectifier and inverter to enable smoothing of a noisy signal during normal operation, and diagnostics/testing capabilities for a single cell. That is, in contrast to the one or more capacitors provided in a fixed portion of a power cell chamber which are used to provide the bulk capacitance needed to operate the inverter, the local capacitor(s) can act as snubbing circuitry to filter out unwanted voltage transients present at the inverter terminals. This is particularly so during switching events occurring in switching devices of the inverter. While shown with this simplified view in the embodiment of FIG. 3, understand the scope of the present invention is not limited in this regard.

Figure 4:
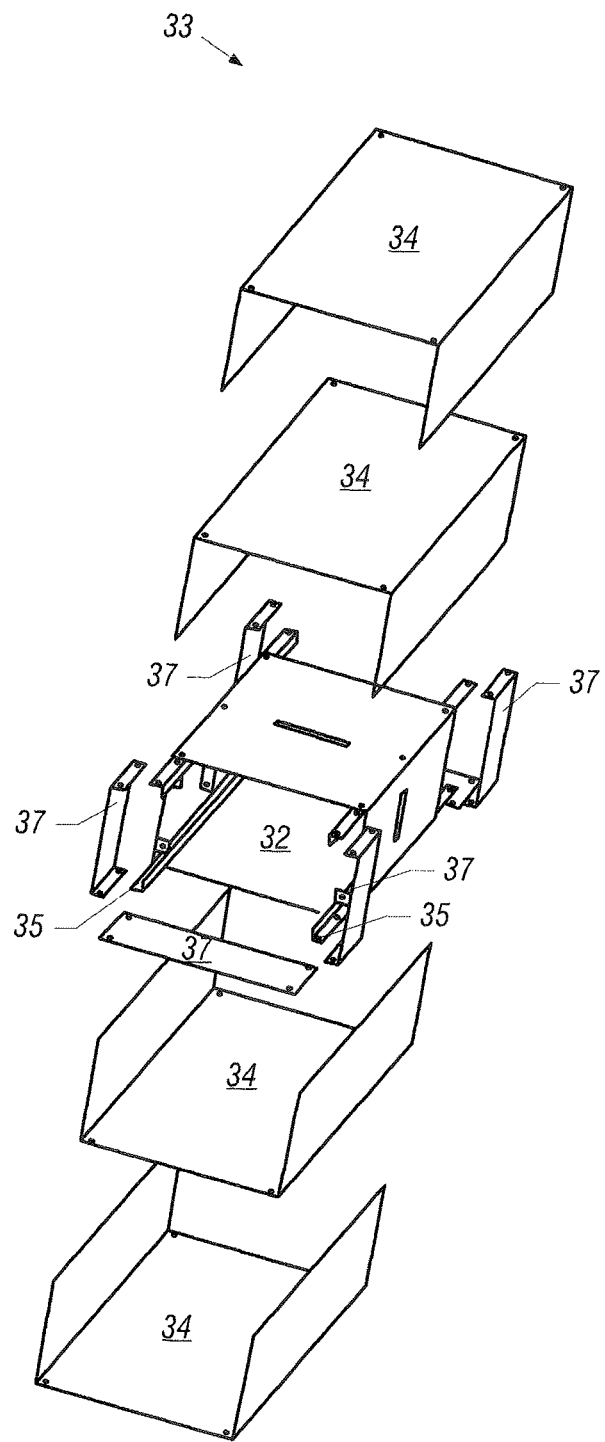
FIG. 4 is a breakaway diagram of a chamber of a power cell cabinet in accordance with one embodiment of the present invention.

Referring now to FIG. 4, shown is a breakaway diagram of a cell chamber of a cabinet in accordance with one embodiment of the present invention. As seen in FIG. 4, chamber 33 includes a power cell insulator portion 32 including rail members 35 at its bottom to allow a movable power cell to be slidably mated into and removed from the chamber. Specifically, rails 31 may enable corresponding rails 35 of the movable power cell to slide. As seen, multiple layers of an isolation barrier 34 may be present to provide insulation to a power cell chamber. In this way, isolation barrier 34 acts as a bubble or cocoon shell in which the power cell chamber is isolated from other equipment of a drive system. The number of layers may depend on a rated voltage of the drive system. For example, depending on the thickness of the individual layers (which can range from less than 1 mm to over 20 mm), operation isolation can exceed 150 kV. In some implementations, 5 or more layers may be provided to enhance isolation.

In various implementations, the layers of isolation barrier 34 may be present between a perimeter of a chamber and rails 35 of the chamber. As further shown in FIG. 4, additional insulation members 37 may be adapted around the power cell insulator portion 32 to enable improved insulation of the power cell. Note that the length of the layers of isolation barrier 34 may extend beyond the length of the power cell module adapted within chamber 33 to improve isolation. Furthermore, this extended length enables a single modular design to be used with power cells of varying rated voltage applications to enable a single modular design to be used with drive systems having widely different voltage rated capabilities.

As described above, a cabinet may include a transformer bay, in which one or more transformers are adapted. Such transformers may have a main primary winding, which may be a three-phase medium voltage winding that receives medium voltage power feed, e.g., from a utility connection. In turn, a set of secondary windings each of which may be a three-phase secondary winding may provide normal operating power to the power cells. These secondary windings may be phase shifted, e.g., by 20 degrees from its neighboring secondary winding, however the scope of the present invention is not limited in this regard. In addition to the main windings for powering the power cells during normal operation, a transformer may further include auxiliary windings to enable pre-charging as well as to handle auxiliary functions, such as for diagnostics, voltage sensing, fan power and so forth.

By separating a transformer into modular units, there is more surface area for the core and thus it can dissipate heat more effectively. Further, each modular core volume may reduce in size since the winding window may only need to accommodate one or a small number of secondary windings per output phase. The modular approach allows a single unit transformer to be used across a wide voltage and power range. By increasing the number of modular units, a drive system in accordance with an embodiment of the present invention can be capable of higher voltage and power with lower harmonic distortion.

In one embodiment of a drive system having multiple modular transformers, the amount of phase shift of secondary and primary windings can be calculated according to the following equations:

$$N_S = \frac{N_{dc}}{N_T} \quad [\text{EQ. 1}]$$

$$\alpha_{sec} = \frac{360}{2 \cdot N_{ph} N_s} \quad [\text{EQ. 2}]$$

$$\alpha_{prim} = \frac{\alpha_{sec}}{N_T} \quad [\text{EQ. 3}]$$

where $N_T$ is the number of transformer modules; $N_{dc}$ is the number of isolated DC sources; $N_S$ is an integer number of the number of secondary windings in each transformer; $N_{ph}$ is the number of phases of a supply; $\alpha_{sec}$ is the secondary windings phase shift in each module; and $\alpha_{prim}$ is the primary winding phase shift in each module.

Modular transformers may be manufactured using transformer manufacturing techniques and implementing various types of winding designs for both primary and secondary windings. Primary windings may include both extended delta configurations and a standard delta configuration. However, the connection of primary and secondary windings can be freely chosen. In various implementations, a desired phase shift may be realized by changing the geometry of the winding, e.g., by adjusting the number of turns of one or more coils of the transformer or taps with regard to other coils. By controlling the number of turns of coils and connection method of them, a given phase shift can be realized. Secondary windings can include standard delta configurations, as well as polygon configurations, where again by changing the size and/or turns of one or more coils, different phase shifts can be obtained. Of course, other configurations or connections can be used to realize a desired phase shift in different implementations.

Figure 5:
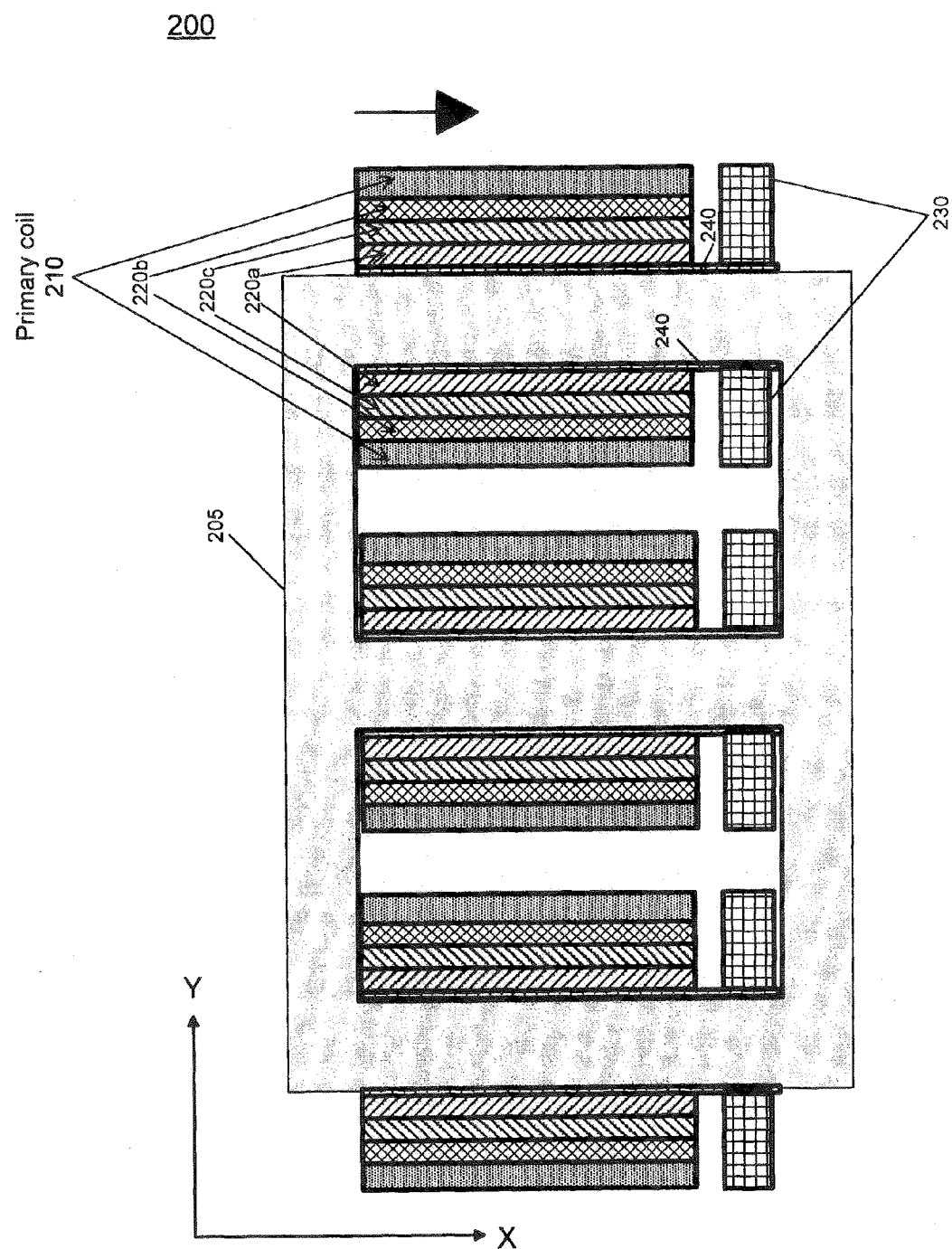
FIG. 5 is an illustration of an example embodiment of a winding geometry of a modular transformer in accordance with one embodiment of the present invention.

As described above, modular transformers may be adapted horizontally to aid in cooling the transfer. FIG. 5 is an illustration of an example embodiment of a winding geometry of a modular transformer. As shown in FIG. 5 is a geometric illustration of a modular transformer 200. As seen, transformer 200 may be a single modular transformer having a generally horizontal configuration (i.e., the windings are wrapped around a horizontal axis X) with a core 205, which may be an iron core having the different windings, both main and auxiliary, wrapped around horizontal columns of the core. Generally, the windings may include a primary coil 210 and a plurality of secondary windings 220. In addition, some implementations may further provide auxiliary power by way of a LV primary auxiliary winding 230 and a LV secondary auxiliary winding 240. However, in some implementations, the auxiliary windings may not be present. Further, the scope of invention is not limited to only a horizontal configuration as this method can be applied to a conventional vertical configuration too.

While FIG. 5 shows a three-phase configuration, and thus having three columns for supporting windings, each adapted on a horizontal axis, reference herein will be with regard to a single phase. As shown, a spatial separation exists between the main coils and the primary LV auxiliary coil. This configuration causes a loose coupling with other windings and a high leakage inductance for the LV primary auxiliary windings. However, the scope of invention is not limited in this aspect and other methods can be applied to generate high leakage inductances for the primary LV auxiliary winding. While the scope of the present invention is not limited in this regard, in a medium voltage implementation in which core 205 is approximately 2 to 10 feet high, this separation may be on the order of between approximately 0.5 and 6 inches to provide the desired high leakage inductance between the primary auxiliary winding 230 and the main secondary windings 220 and main primary winding 210.

As seen, the configuration of the main secondary windings 220 is such that these windings are wrapped concentrically around each other, and further that these windings are also concentrically wrapped around the auxiliary secondary winding 240. Note that in the implementation of FIG. 5, auxiliary secondary winding 240 may extend substantially along the entirety of the column length of core 205 and may have the main secondary windings 220 wrapped there around.

Thus in the particular implementation, the secondary windings 220 may be next concentrically adapted, e.g., in order of a first phase-shifted secondary winding 220aa second phase-shifted secondary winding 220c, and finally a non-phase shifted secondary winding 220b. Finally, wrapped concentrically around these windings is the main primary winding, MV winding 210. The spacing between coils corresponds to cooling method and isolation and voltage level of the coils. Thus while described above as a forced air cooling technique, this method can be applied to natural cooled, and water cooled transformers. Various transformer manufacturing techniques can be used in realizing the coils and insulation. As examples, different wire types (e.g., round, square, or so forth) and different insulation materials (e.g., NOMEX™ felt or paper insulation, fiber, wood, epoxy, or so forth) can be used.

The configuration shown in FIG. 5 thus provides for loose coupling between the primary auxiliary winding 230 and the main windings 210 and 220 (in particular, main secondary windings 220). However, different winding geometries or methods can be implemented to provide high leakage inductance for the LV auxiliary primary winding.

Note that in FIG. 5, direction from left to right may correspond from a front to a rear of a cabinet in which the transformer is adapted. In this way, a horizontal arrangement is realized such that air flow coming from an input mechanism such as a grill at a front panel of the transformer bay may receive air which is pulled through the grill and across the windings (and core) from a front to a rear portion of the cabinet. Then the air may be forced up through a rear of a cabinet and output via fans or other cooling members that act to pull the air across the transformers and up and out through these exhaust fans. In this way, improved cooling can be realized as a large volume of air that travels in a substantially linear and generally laminar flow can occur, without the need for baffles or other air handling or director equipment. Note that FIG. 5 shows only a single modular transformer and in various implementations three or more such transformers may be present in a transformer bay of a cabinet in accordance with an embodiment of the present invention. When multiple such transformers are present, spacing may be maintained between the transformers such that at least some amount of open space is present between the windings of the two transformers, such that air flow may pass and magnetic and electric isolation is maintained between the transformers.

When using auxiliary windings in accordance with an embodiment of the present invention at power-up of a drive, power is supplied through the high leakage inductance LV auxiliary primary winding(s). The high inductance of this set of windings can slow the rate of capacitor charging and limit the in-rush current to the drive. Furthermore, another auxiliary secondary winding can be embedded into a transformer module for providing power to cooling fans or any other auxiliary power usage. Of course, a given system may not implement any auxiliary windings.

Figure 6:
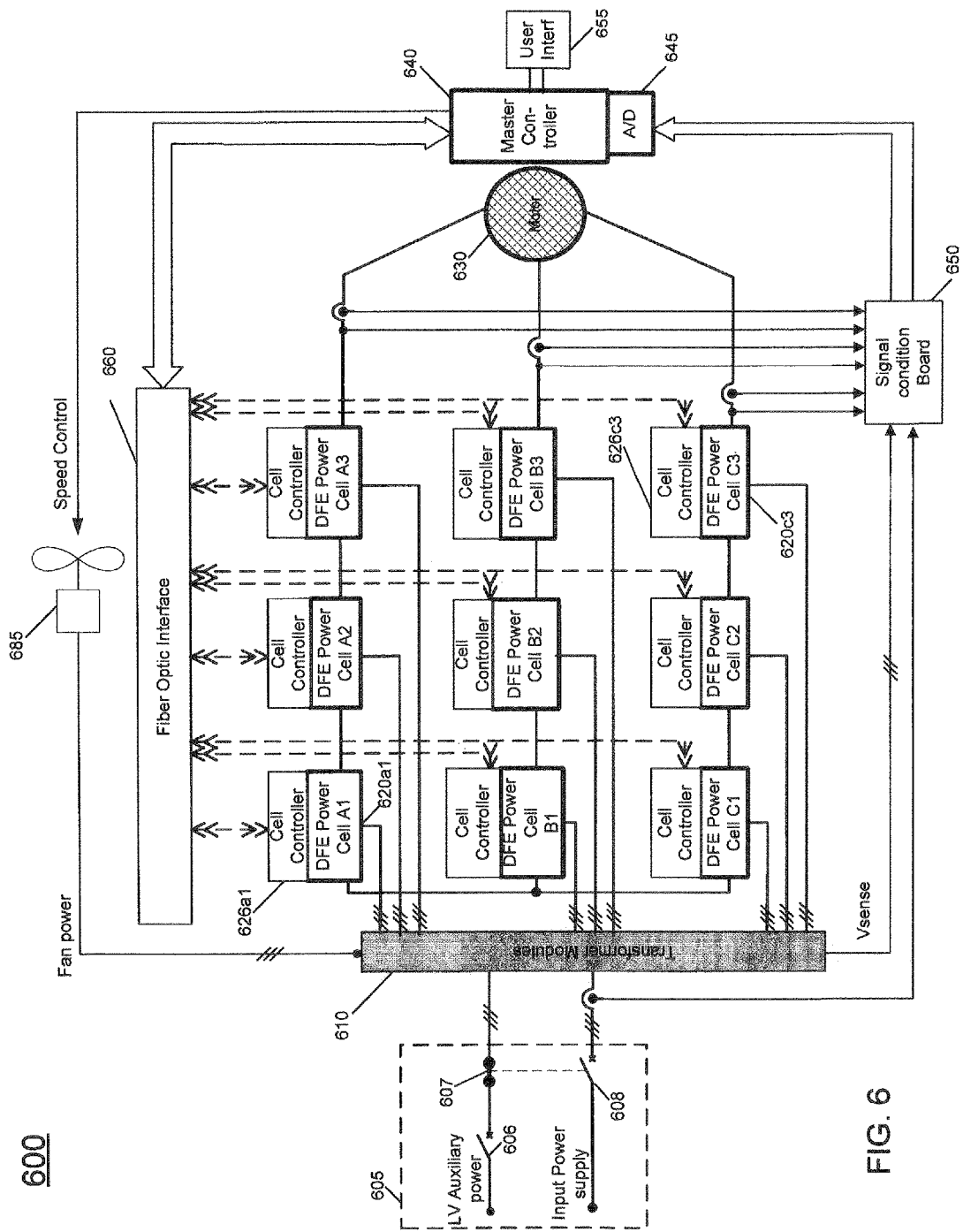
FIG. 6 is a block diagram of a system in accordance with an embodiment of the present invention.

Referring now to FIG. 6, shown is a block diagram of a system in accordance with an embodiment of the present invention. As shown in FIG. 6, system 600 may be a medium-voltage drive. Specifically, in the embodiment of FIG. 6, a three-phase, medium-voltage drive is shown that includes a plurality of power cell chambers $620_{A1}$-$620_{C3}$ (referred to in FIG. 6 as diode front end (DFE) cells). As seen, a local cell controller $626_{A1}$-$626_{C3}$ is associated with each of the power cell chambers. Understand that while shown as a single enclosure, each of the power cell chambers may be separated into a fixed portion and a moveable portion and that the local cell controller may in some embodiments be adapted within an enclosure of the moveable power cell. Also, understand that while not shown in FIG. 6 for ease of illustration a plurality of power service buses may be configured between these different portions of the power cells and furthermore may provide for connections between each power cell and a master controller 640.

As seen, each of these local controllers may communicate with a fiber optic interface 660. In some implementations, a pair of unidirectional fiber optic channels may be coupled between each local controller and fiber optic interface 660. In turn, fiber optic interface 660 communicates with a master controller 640 that further includes an ADC 645.

Master controller 640 may provide control signals to fiber optic interface 660 for transmission to the different local controllers. In one embodiment, these control signals may be voltage reference signals, which cause the local controllers to perform certain processing to generate the needed switching signals. In other implementations, the switching signals themselves may be sent by master controller 640 for transmission to the local cell controllers.

As further seen in FIG. 6, a signal conditioning board 650 may be present to sense or perform signal processing with regard to various information, namely voltage and/or current information obtained both from the input power source and the output of the different phase output lines coupled to a load 630 which in one embodiment may be a motor, as well as from an auxiliary secondary winding in accordance with an embodiment of the present invention.

In addition to the control information described above, additional information from master controller 640 can be provided to the individual local controllers. In addition, the local controllers can provide information such as status information, both as to normal operation as well as faults, over-temperature situations or so forth, back to master controller 640. Master controller 640 may further be associated with a user input device 655 such as a keyboard and/or touch screen display and which may be adapted within a user interface bay to enable user input to control various features such as speed, torque, selection of different power cells to be enabled and so forth, as well as to provide status information to the user via a given display or other output means.

As shown in FIG. 6, input power to transformer modules 610 may include both a medium voltage source, e.g., from an input power supply such as a utility connection, and a low voltage power source, e.g., from an auxiliary low voltage power source, as discussed above. Such sources may be provided to a customer cabinet 605, which may be at a separate location from a cabinet of drive system 600. Cabinet 605 may include a control circuit to switch between powering of the drive by either the main power source or the auxiliary power source. For example, at power-up, a switch 606, which may be a circuit breaker, of the low voltage auxiliary power line is closed such that power is provided to transformer module 610 through a normally closed contact 607 to enable pre-charging of the capacitors of the different power cells 620 via this low voltage source. Accordingly, the capacitors of power cells 620 are charged through LV auxiliary primary winding(s) of transformer module 610 to a predetermined voltage level. Then after passing of a predetermined time, which may be on the order of approximately 50 to 10000 milliseconds (ms), a main power supply power switch 608 (e.g., a MV circuit breaker) is closed. Normally closed contact 607 can be used to disconnect the LV auxiliary power. By closing the main power supply, the capacitors are thus charged to their rated voltage. A timer or programmable logic controller (PLC) or other type of control circuit can be used to control the process and sequence of switching. In another embodiment, the master controller can determine this charging time by monitoring the DC-bus voltage of one or more power cells. After the capacitors of power cells are charged to a predetermined level, the master controller can send an activation signal to MV circuit breaker 608. However in either implementation method, the sequence of switching for powering-up the drive is first to close the LV auxiliary switch 606 (i.e. circuit breaker). After a predetermined time or receiving a command from a controller, the LV switch 608 is opened and main power switch 608 (i.e., MV circuit breaker) is closed. Note in other implementations, direct connection form utility to drive system 600 may occur (i.e., without customer cabinet 605).

Figure 7B:
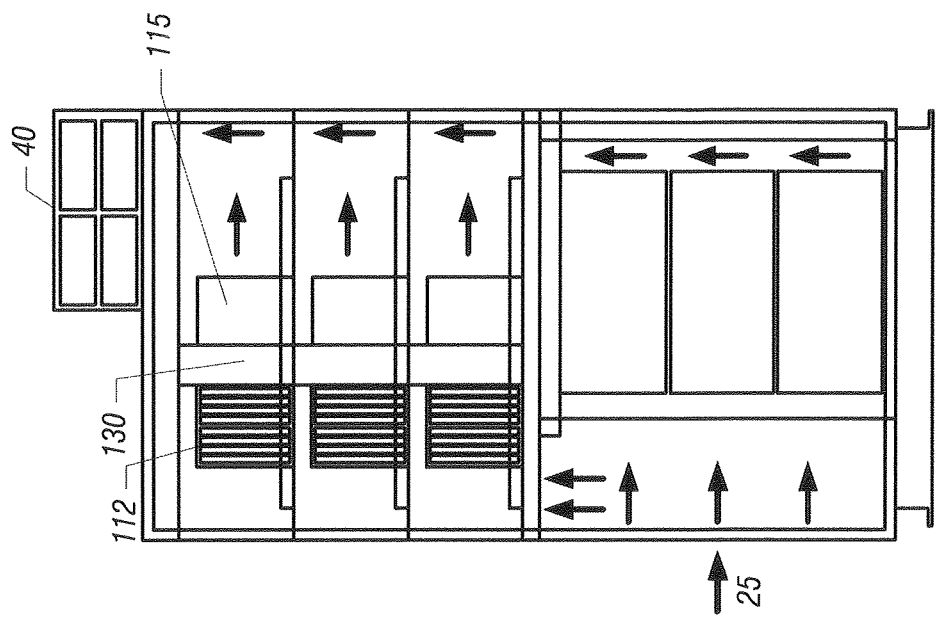
FIG. 7B is a side view of the cabinet that illustrates air flow for cooling in accordance with an embodiment of the present invention.
Figure 7A:
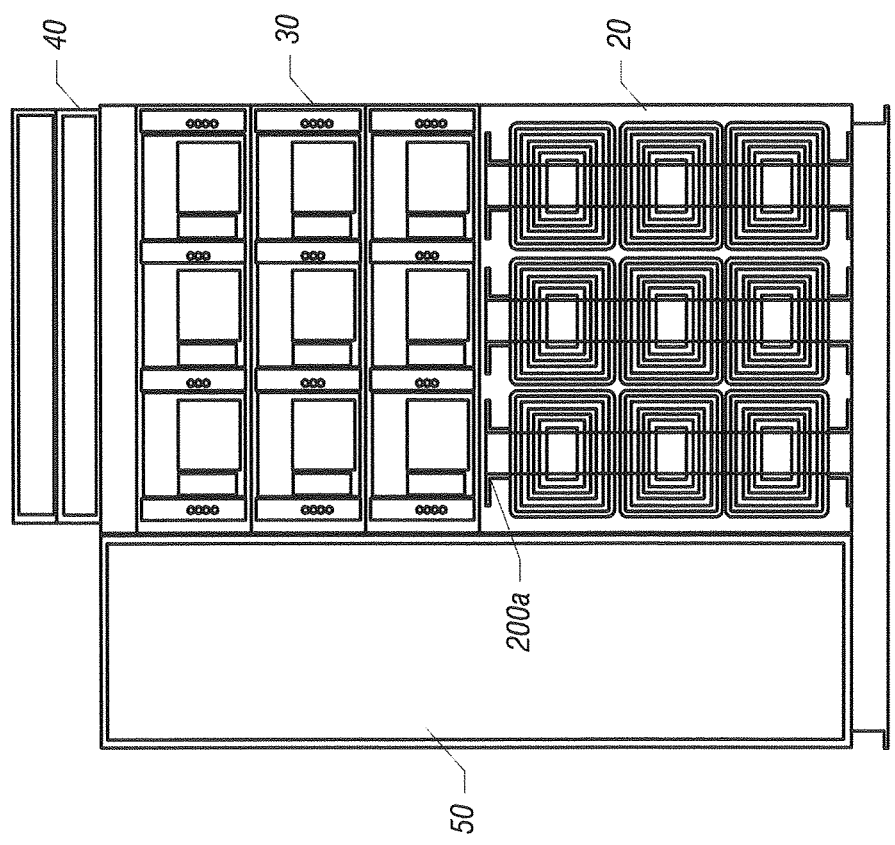
FIG. 7A is an illustration of a cabinet in accordance with one embodiment of the present invention.

Referring now to FIG. 7A, shown is an illustration of a cabinet in accordance with one embodiment of the present invention. As shown as FIG. 7A, a cabinet that houses a drive system, e.g., a medium voltage drive system, includes a transformer bay 20, a power cell bay 30, a fan bay 40, and a cabinet controller bay 50.

The illustration of FIG. 7A further shows the horizontal configuration of three transformers $200_a$-$200_c$, each of which includes a core having three columns, one for each of three phases, each having a horizontally aligned axis around which primary and secondary coils may be concentrically wrapped. Also seen are the illustrations of individual power cell chambers $32_a$, which show the moveable portions that are formed of an enclosure with heat sinks adapted on top and bottom portions.

Referring now to FIG. 7B, shown is a side view of the cabinet that illustrates air flow for cooling in accordance with an embodiment of the present invention. As seen in FIG. 7B, a grill or other input mechanism 25 may be provided at a forward panel of transformer bay 20 to enable incoming air flow. As seen, the incoming air flow passes horizontally through transformers 200, as well as passing vertically up to the power cell bay. The laminar air flow through transformers 200 may then be vertically removed through an air duct at a rear of the cabinet by fans within fan bay 40.

FIG. 7B further shows the configuration of the power cell chambers which are formed from the moveable enclosure 110, power service bus 120 and capacitor of the fixed portion 115 (note that other components may be present in the fixed portion as discussed above, e.g., with reference to FIG. 2A). As seen in FIG. 7B, the air flow through the power cell bay may further be provided vertically upward via fans within fan bay 40. While shown with this particular implementation in the embodiment of FIGS. 7A and 7B, the scope of the present invention is not limited in this regard.

As described above, a modular power control system includes building blocks that can be used to configure systems having one or more cabinets. A modular system may include one or more cabinets, each of which may be configured such as described above with regard to FIG. 1. Still further, a master control cabinet per system may be provided to enable centralized control for the overall system. Thus in various embodiments, a power control system may include a master control cabinet and one more or more cell cabinets that can be identically configured. The number and interconnect configuration of the cell cabinets determine the current and voltage capacity of the overall system. In different implementations, the cabinets can be configured in parallel for greater current and/or in series for greater voltage applications.

The control and diagnostics for the modular system can also be distributed among the major components. The master controller provides control information to each cell cabinet. Each cell cabinet provides local control of the power cells, via a cabinet controller. Status information is provided from the power cells to each cabinet controller. The cabinet controller then provides cabinet status back to the master controller. In various embodiments, diagnostics are run locally for each major component. Each power cell controller, cell controller, and master controller initiates local operations to assess operational readiness. Cell cabinet operational readiness is then communicated back to the master controller, and the master controller then determines the overall readiness of the system.

Figure 8A:
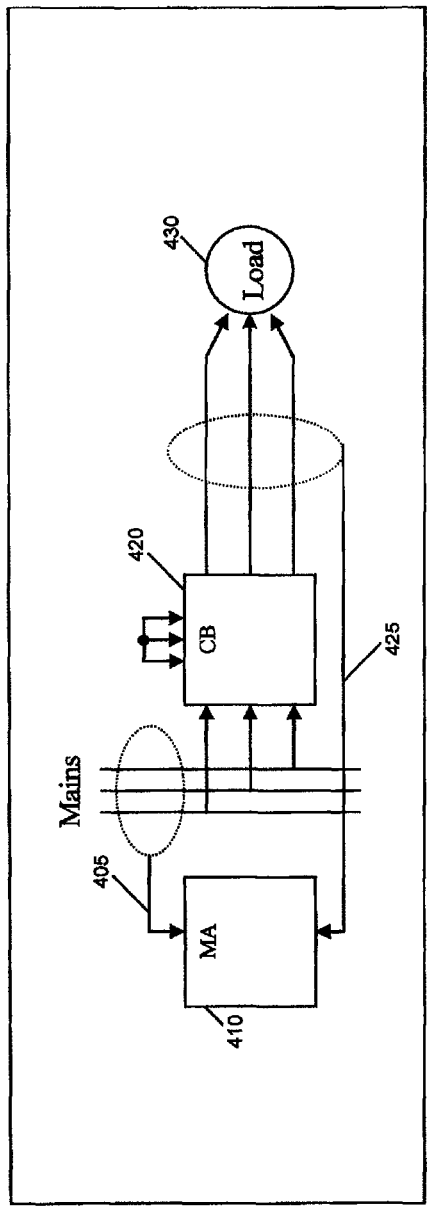
FIG. 8A is a block diagram of a modular system configuration in accordance with one embodiment of the present invention.

Referring now to FIG. 8A, shown is a block diagram of a modular system configuration in accordance with one embodiment of the present invention. As shown in FIG. 8A, system 400 may be a minimal modular system, e.g., for a relatively low medium voltage application in which only a single power cell cabinet 420 is present and which in turn is coupled to a load 430. As seen, cabinet 420 is coupled to receive input power from, e.g., a set of AC mains. Feedback information, namely the input current and voltage may be provided via a feedback path 405 to a master control cabinet 410, which may further receive a feedback regarding the output voltage and current from power cell cabinet 420.

Figure 8B:
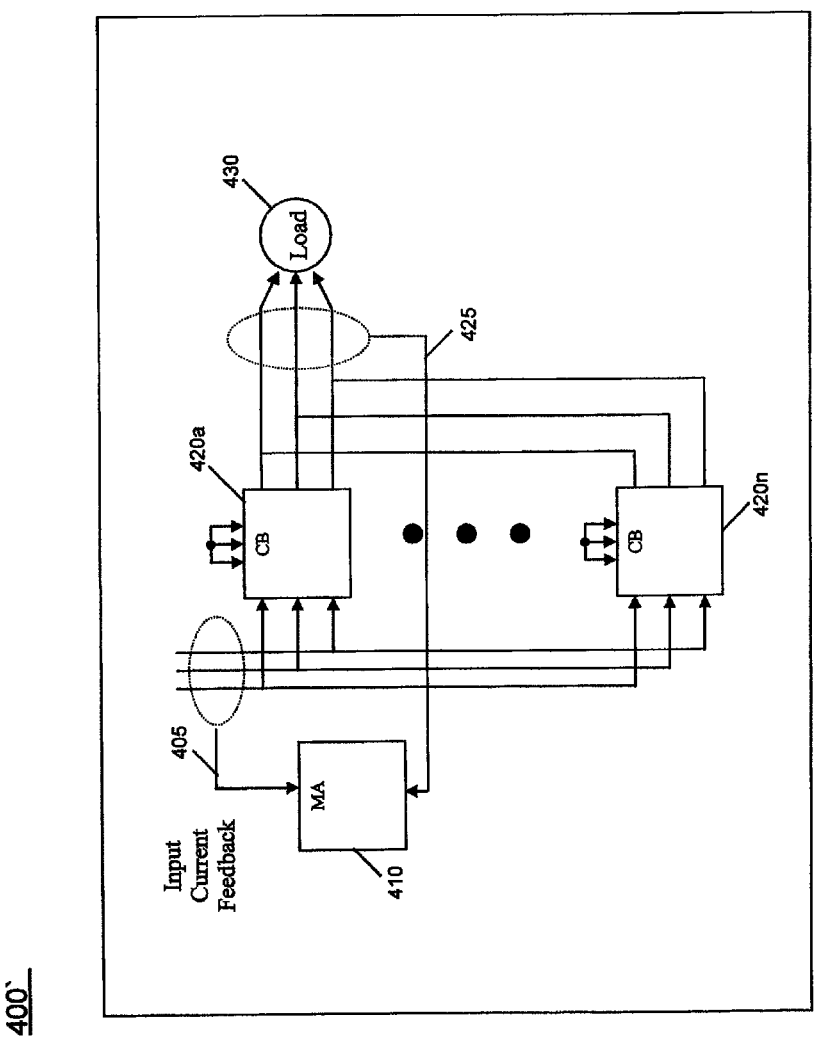
FIG. 8B is a block diagram of a parallel modular system configuration in accordance with an embodiment of the present invention.

In other implementations, a different configuration may be realized. Referring now to FIG. 8B, shown is a block diagram of a parallel modular system configuration in accordance with an embodiment of the present invention. As shown in FIG. 8B, system 400' includes a plurality of power cell cabinets 420$_a$-420$_n$ coupled in parallel to increase drive output current capability. Each power cell cabinet is paralleled to the AC mains and provides output current to load 430. The master control 410 maintains load sharing among cabinets 420$_a$-420$_n$ by processing current feedbacks via 405 and 425.

In yet other implementations a series configuration is possible. Referring now to FIG. 8C, shown is a block diagram of a series configuration. As seen in FIG. 8C, system 400'' includes a plurality of power cell cabinets 420$_a$-420$_n$ coupled in series, such that the outputs are cascaded to provide a wide range output voltage capability to load 430. Similar feedback connections to master cabinet control 410 are provided to preserve load voltage sharing among the power cell cabinets. Other implementations may use combinations of parallel and serial configurations to increase load voltage and current capability.

Figure 9A:
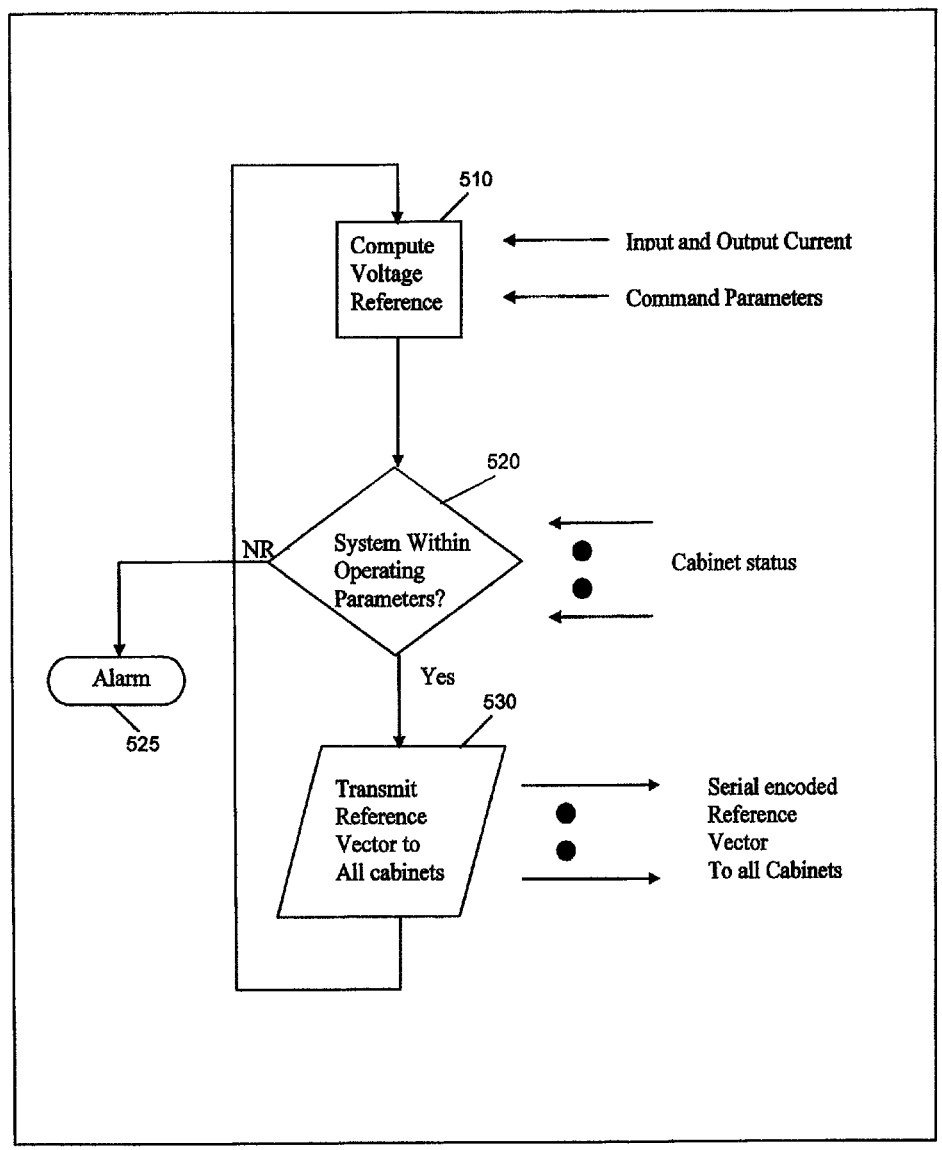
FIG. 9A is a flow diagram for a basic control loop for a master controller in accordance with one embodiment of the present invention.

Referring to FIG. 9A, shown is a flow diagram of a basic control loop for a master controller in accordance with one embodiment of the present invention. As shown in FIG. 9A, method 500 may be performed on a continual basis by the master controller. Specifically, based on input current and output voltage and current information received in the master controller, and various command parameters, including current and voltage ratings, speed, frequency, torque and so forth, a voltage reference may be computed (block 510). In one embodiment, the voltage or current reference may be computed using a standard motor vector control algorithm, e.g., processing torque and flux commands, and rotor position. Next, it may be determined based on various information coming from the different cabinets whether the system is operating within its operating parameters (diamond 520). If not, an alarm may be triggered (block 525) followed by a master control action if required. Otherwise, normal operation may continue and a reference vector may be transmitted to all cabinets (block 530). In one embodiment, this reference vector may be serially encoded and sent to the cabinets, e.g., via a fiber optic interface.

Figure 9B:
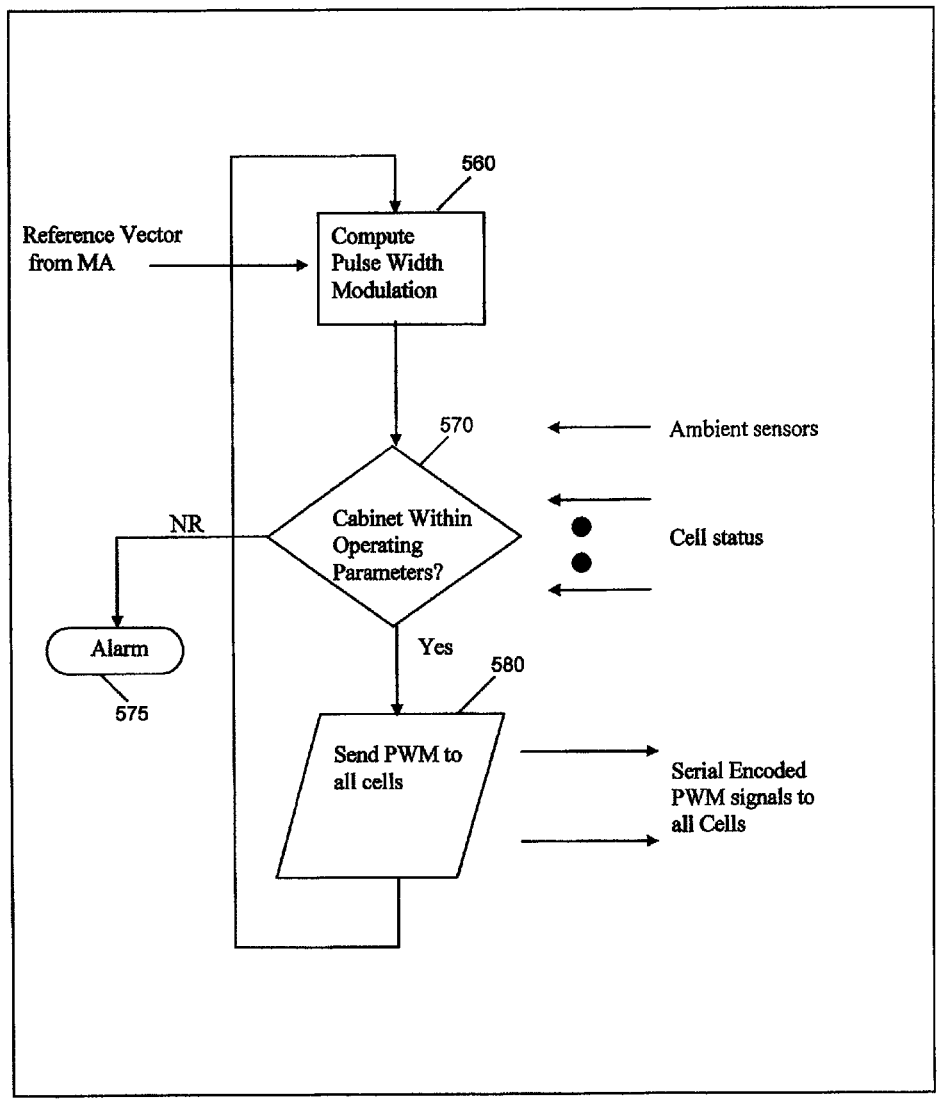
FIG. 9B is a flow diagram for a basic control loop for a cabinet in accordance with one embodiment of the present invention.

Referring now to FIG. 9B, shown is a flow diagram for a basic control loop for a cabinet in accordance with one embodiment of the present invention. As seen in FIG. 9B, method 550 may begin by receiving the reference vector from the master controller in a cabinet controller. From this reference vector, a switching pattern using a carried based pulse width modulation scheme or any other modulation technique for the cells within the cabinet may be computed (block 560). In one embodiment, this PWM calculation may be in accordance with commands received from the master controller and general drive operation status. Then based on various status information, including information from ambient sensors and the various power cells, it may be determined whether the cabinet is operating within its operating parameters (diamond 570). If not, an alarm may be triggered (block 575). Otherwise, normal operation may continue and the PWM signals may be sent to the power cells of the cabinet (block 580). In one embodiment, the PWM signals may be serially encoded and sent to the cells, e.g., via a fiber optic interface.

Figure 9C:
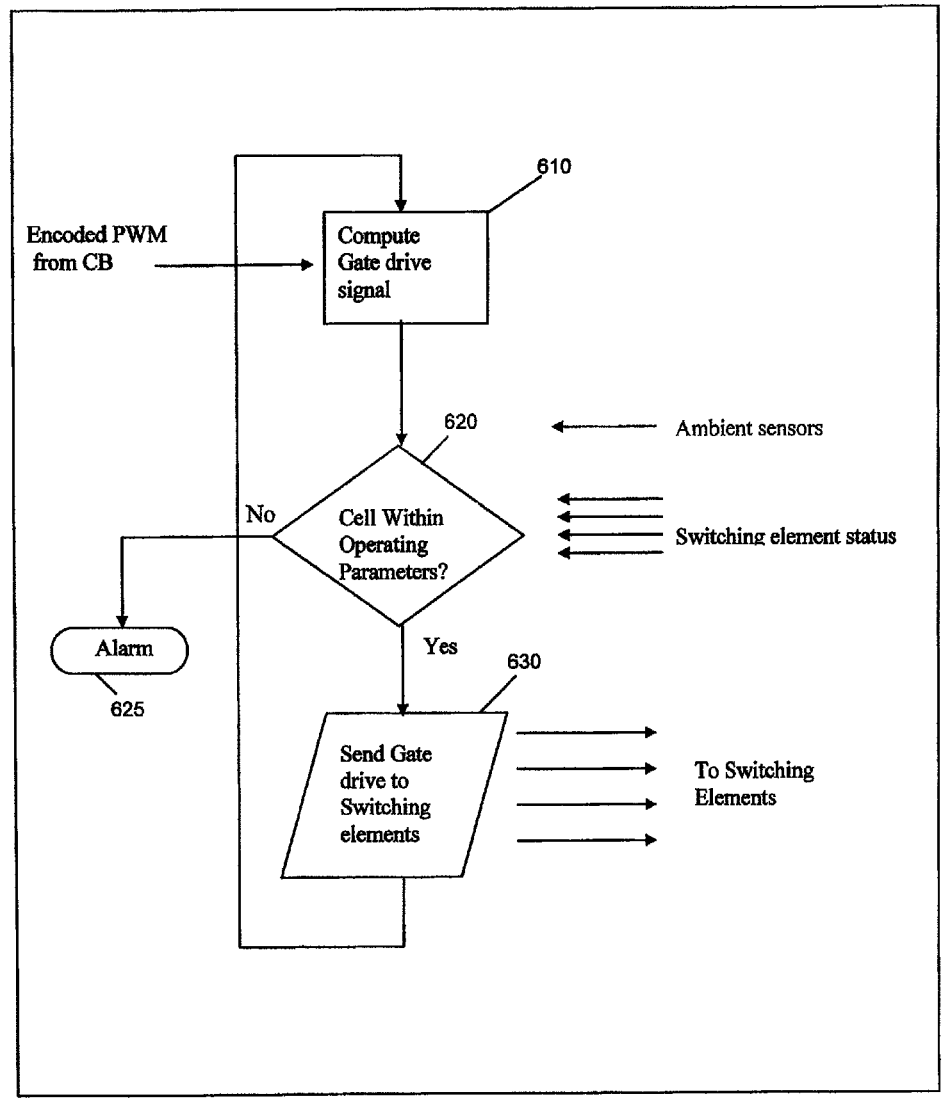
FIG. 9C is a flow diagram for a method for performing control of a power cell in accordance with one embodiment of the present invention.

Referring now to FIG. 9C, shown is a flow diagram of a method for performing control of a power cell via a local controller of the power cell in accordance with one embodiment of the present invention. As shown in FIG. 9C, method 600 may begin by each local controller receiving encoded PWM signals from the cabinet controller of the cabinet. From this information gate drive signals may be computed (block 610). In one embodiment, these signals may be computed by a local FPGA within the moveable cell section, and that these computations are based on cell status and PWM command signals received from the cabinet controller. Then, based on various information including ambient sensors and the status of the switching elements themselves, it may be determined whether the cell is operating within its operating parameters (diamond 620). If not, an alarm may be triggered (block 625). Otherwise, normal operation may continue and gate drive signals may be sent to the switching elements (block 630). While shown with this particular control implementation in the embodiment of FIGS. 9A-9C, the scope of the present invention is not limited in this regard. Furthermore, understand that the various control operations described may be performed in different orders and may be performed in different controllers such that the different control can be handled at a more local or global basis depending on a desired implementation.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A medium voltage drive system comprising:
a plurality of modular cabinets, each modular cabinet including a transformer bay to house at least one transformer to couple between a utility connection and a plurality of power cells, the at least one transformer having a core with a plurality of columns each adapted along a horizontal axis, each column corresponding to a phase, where each phase includes a primary winding and a plurality of secondary windings concentrically adapted about the column horizontal axis such that the at least one transformer has a horizontal configuration, and a power cell bay including a plurality of cell chambers each having a protective enclosure in which to house a corresponding one of a plurality of power cells, each of the protective enclosures including a plurality of insulative members adapted in an interlocking configuration to insulate the corresponding power cell, the plurality of cell chambers each having a power service bus to couple the corresponding power cell pluggable to a first face of the power service bus with a second portion of the power cell chamber, the power cell having a plurality of switching devices on a first side thereof, a plurality of rectification devices on an opposite side to the first side, and a low inductance path coupled between the switching devices and the rectification devices, the second portion having a DC link including a power capacitor coupled to a second face of the power service bus, the power cell separate from the second portion, and a cabinet controller bay having a cabinet controller to receive reference control signals from a master controller.

2. The medium voltage drive system of claim 1, further comprising the master controller coupled to the plurality of cabinet controllers to receive input current information, output current information, command parameters regarding a selected operating point of the medium voltage drive system, and status information from the plurality of modular cabinets, and to provide the reference control signals to the plurality of cabinet controllers.

3. The medium voltage drive system of claim 1, wherein the plurality of modular cabinets are coupled in parallel to provide an AC output to a load.

4. The medium voltage drive system of claim 1, wherein the plurality of modular cabinets are coupled in series such that an AC output from each of the plurality of modular cabinets is cascaded to provide a cascaded AC output to a load.

5. The medium voltage drive system of claim 2, wherein each of the cabinet controllers is to receive status information from the plurality of power cells and status information from a plurality of sensors of the modular cabinet and to generate a set of switching signals to transmit to each of the plurality of power cells based on the reference control signals.

6. The medium voltage drive system of claim 5, wherein each of the power cells includes a local controller to receive the set of switching signals and to transmit drive signals to the plurality of switching devices based thereon.

7. The medium voltage drive system of claim 2, further comprising a master controller cabinet including the master controller.

8. The medium voltage drive system of claim 1, wherein each of the plurality of modular cabinets includes a grill member adapted on a front portion of the transformer bay to enable ambient air to be pulled across the at least one transformer in a substantially horizontal and laminar flow, wherein the air is to thereafter flow vertically through an air duct at the rear of the cabinet and out of the cabinet at a top portion thereof.

* * * * *